US007235348B2

(12) United States Patent  
Ho et al.

(10) Patent No.: US 7,235,348 B2
(45) Date of Patent: Jun. 26, 2007

(54) WATER SOLUBLE NEGATIVE TONE PHOTORESIST

(75) Inventors: Bang-Chein Ho, Hsin-chu (TW); Jian-Hong Chen, Hsin-chu (TW); Yusuke Takano, Tokyo (JP); Ping-Hung Lu, Bridgewater, NJ (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 124 days.

(21) Appl. No.: 10/443,359

(22) Filed: May 22, 2003

(65) Prior Publication Data

US 2004/0234897 A1 Nov. 25, 2004

(51) Int. Cl.
*G03F 7/26* (2006.01)
(52) U.S. Cl. ........................... 430/312; 430/394
(58) Field of Classification Search ............. 430/270.1, 430/312, 313, 394
See application file for complete search history.

(56) References Cited

U.S. PATENT DOCUMENTS

| 5,017,461 | A | | 5/1991 | Abe ........................... 430/325 |
| 5,308,741 | A | | 5/1994 | Kemp ......................... 430/312 |
| 5,376,483 | A | * | 12/1994 | Rolfson ........................ 430/5 |
| 5,432,044 | A | | 7/1995 | Shimizu ..................... 430/269 |
| 5,532,113 | A | | 7/1996 | Fréchet et al. .............. 430/296 |
| 5,573,634 | A | | 11/1996 | Ham .................... 156/659.11 |
| 5,648,196 | A | | 7/1997 | Fréchet et al. .......... 430/270.1 |
| 5,998,092 | A | | 12/1999 | McCulloch et al. ..... 430/270.1 |
| 6,664,011 | B2 | * | 12/2003 | Lin et al. ....................... 430/5 |
| 6,800,415 | B2 | * | 10/2004 | Lu et al. .................. 430/270.1 |
| 6,905,621 | B2 | * | 6/2005 | Ho et al. ...................... 216/47 |
| 2003/0104319 | A1 | * | 6/2003 | Lin et al. .................... 430/313 |
| 2005/0106493 | A1 | * | 5/2005 | Ho et al. ................. 430/270.1 |

* cited by examiner

*Primary Examiner*—Kathleen Duda
(74) *Attorney, Agent, or Firm*—Thomas, Kayden, Horstemeyer & Risley

(57) ABSTRACT

In accordance with the objectives of the invention a new water soluble negative photoresist is provided for packing-and-unpacking (PAU) processing steps.

33 Claims, 3 Drawing Sheets

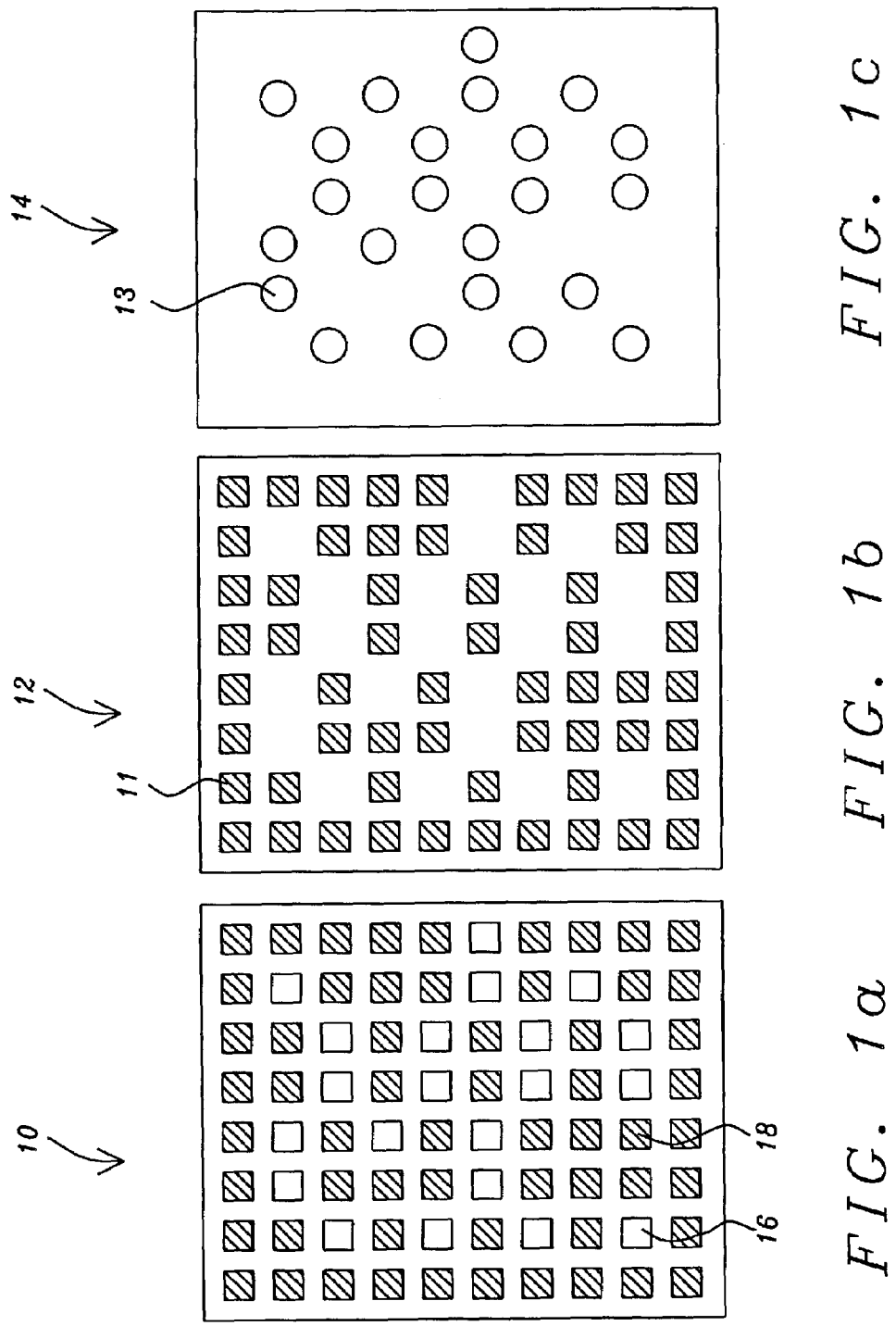

WATER SOLUBLE NEGATIVE TONE PHOTORESIST

RELATED PATENT APPLICATION

This application is related to (TS01-376), filed on Nov. 30, 2001, Ser. No. 10/002,986, and to (TS01-463), filed on Dec. 5, 2001, Ser. No. 10/005,806, assigned to Common Assignee

BACKGROUND OF THE INVENTION (1) Field of the Invention

The invention relates to the fabrication of integrated circuit devices, and more particularly, to particular chemistries for negative photoresist.

(2) Description of the Prior Art

Integrated semiconductor devices comprise electronic circuits of sub-micron and deep sub-micron dimensions and are typically created in or on the surface of a silicon substrate. The creation of semiconductor devices is supported by sophisticated and interacting, mutually supporting disciplines.

Device features are transposed from a mask onto a semiconductor surface using photolithographic imaging processes. Since this exposure depends on the transfer of photo energy from a source to a target surface, it is to be expected that, for target features that are created in very close proximity to each other, the transfer of photo energy interacts for very closely spaced device features, most commonly interconnect lines or contact holes having sub-micron spacing between adjacent lines.

A common measure for the occurrence of such interaction are applications where the Critical Dimensions (CD) of the layout of the Integrated Circuit (IC) approach the resolution limit of the lithography equipment. For such applications, proximity effects begin to influence the manner in which mask images are transferred to target surfaces. This interaction imposes limitations on the proximity of adjacent device features, these limitations are referred to as Critical Dimensions (CD) of a design and device layout.

Related application (TS01-376), filed on Nov. 30, 2001, Ser. No. 10/002,986, addresses problems and limitations that are encountered when creating openings on a semiconductor surface such as the surface of a layer of photoresist or the surface of a semiconductor substrate. This application provides two masks. The first mask, referred to as the packed mask, comprises the desired contact holes, which are part of the creation of a semiconductor device. To the packed mask are added padding holes in order to increase and condense the hole density of the packed mask. The second mask, referred to as the unpacking mask, comprises openings at the same locations as the locations of the padding holes of the first mask, the openings provided in the second mask have slightly larger dimensions than the padding holes of the first mask. A first exposure is made using the packed mask, a second exposure of the same surface area is made using the unpacking mask. The unpacking mask is used to selectively cover the padding contact holes, resulting in the final image. Two types of unpacking masks can be used, a first type having unpacking holes that surround the desired hole pattern, a second type having unpacking holes that align with the desired hole pattern.

Related application (TS01-463), filed on Dec. 5, 2001, Ser. No. 10/005,806 provides a method of creating contact holes using a packing and unpacking procedure, further applying a phase-shift mask. The Depth Of Focus (DOF) and Mask Error Factor (MEF) of closely packed holes can be improved using Alternating Phase Shifting Mask (Alt PSM) for the exposure of the holes. However, the Alt PSM is dependent on hole density or hole separation and is less effective where holes are relatively further separated from each other. In order to improve DOF and MEF performance for the creation of holes, the application adds extra holes to a given pattern of contact holes on the surface of a first mask, thus densifying the pattern of holes on the first mask and therefore reducing the range of the hole-diameter to hole separation ratio. The pattern of added holes is alternating in phase with the pattern of desired holes. The added holes will be filled up using a second mask.

U.S. Pat. No. 5,573,634 (Ham) shows a contact hole process using a double exposure photoresist process.

U.S. Pat. No. 5,308,741 (Kemp) shows a double exposure process with mask shifting and phase shifting.

U.S. Pat. No. 5,432,b44 (Shimizu) shows a double exposure process with a phase shift masks (PSM).

U.S. Pat. No. 5,017,461 (Abe), U.S. Pat. No. 5,998,092 (McCulloch et al.) U.S. Pat. No. 5,648,196 (Frechet et al.) and U.S. Pat. No. 5,532,113 (Frechet et al.) are related patents.

SUMMARY OF THE INVENTION

A principle objective of the invention is to provide optimized use of photoresist coating for packing-and-unpacking methods of photoresist exposure.

Another objective of the invention is to provide use of photoresist coating for packing-and-unpacking methods of photoresist exposure that allow optimum pattern density of the created pattern.

In accordance with the objectives of the invention a new water soluble negative photoresist is provided for packing-and-unpacking (PAU) processing steps.

BRIEF DESCRIPTION OF THE DRAWINGS

FIGS. 1a through 1c show the application of an Alt PSM of regularly packed holes and an unpacking mask to designate the unwanted holes for back fill.

DESCRIPTION OF THE PREFERRED EMBODIMENTS

Figure 2A:
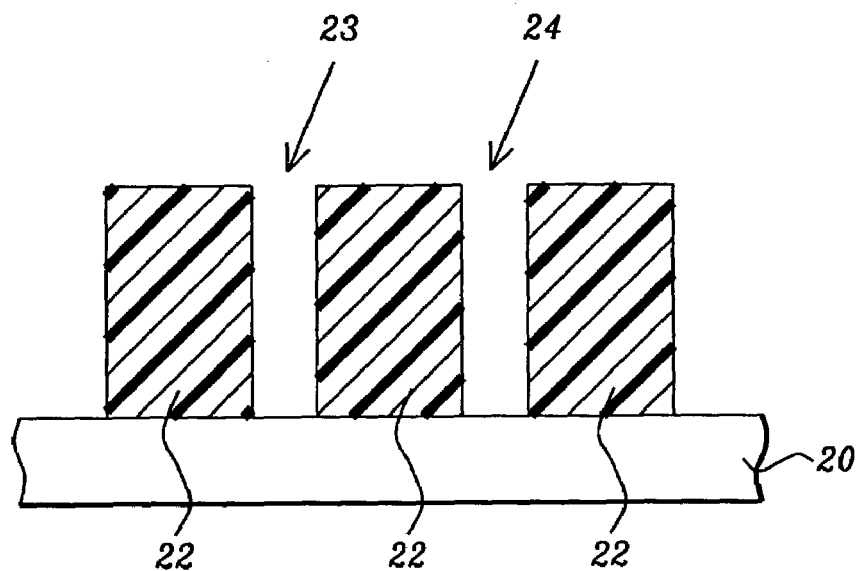
FIGS. 2a through 2d show Packing and Unpacking (PAU) with two coatings of photoresist.

The instant invention applies to the use of two photolithographic exposure masks. The first exposure mask is a packed exposure mask, which comprises holes with a single hole-to-separation ratio. This ratio may typically be a ratio of 1:1 but is not limited to this and can be extended to include any ratio that is within the effective range of the Alt PSM. The second mask, the unpacking mask, comprises holes that are slightly larger than the holes in the packed mask. The holes provided in the unpacking mask have a slightly larger diameter than the holes in the packed mask, the holes provided in the unpacking mask center on the desired holes. As a first processing step in creating a hole pattern, the packed mask is used to delineate both types of holes. After this exposure has been completed, the unpacking mask is used to selectively cover the padding holes, resulting in a final image.

In using PAU with two photoresist coatings, see FIGS. 2a through 2d, the first photoresist coating 22 is exposed with the packed mask and developed as usual. As a second step, a compatible second layer 26 of photoresist is coated over the surface of the delineated image of the first photoresist coating without affecting the first photoresist coating.

For the application of the second photoresist coating it may be required, in order to maintain the image created in the first coating of photoresist, to harden and/or cross link the first layer of photoresist. For this purpose two layers of photoresist can be used for the formation of the first coating of photoresist, the bottom layer of these two layers of photoresist is first cross linked after which an imaging layer of photoresist is coating over the surface of the cross linked layer of photoresist. The imaging layer preferably comprises elements that form a non-volatile compound, such as silicon, during Reactive Ion Etch (RIE) of oxide or oxide containing layers. The imaging layer is then delineated by applying $O_2$ RIE etching and serves as the first layer of photoresist.

For the second layer of photoresist that is required for the procedure of using PAU with two photoresist coatings, either positive or negative photoresist can be used.

If a positive photoresist is used for the second layer of photoresist, a light-field unpacking mask based on the padding holes results in coverage of the padding holes and a dark-field unpacking mask based on the desired holes results in coverage of the background.

If a negative photoresist is used for the second layer of photoresist, a dark-field unpacking mask based on the padding holes exposes the second layer of photoresist at the padding holes to make them insoluble in the resist developer, resulting in coverage of the padding holes. Alternatively, a light-field unpacking mask based on the desired holes exposes the negative second layer of photoresist in all areas except where the desired holes are located and results in coverage of the background.

The above described process will now be further highlighted using FIGS. 1a through 1c and 2a through 2c for this purpose.

Referring specifically to FIGS. 1a through 1c, there is shown the application of an Alt PSM of regularly packed holes and an unpacking mask to designate the unwanted holes for back fill, as follows:

10, FIG. 1a, shows a packed mask 16, one of the holes that is provided on the packed mask 10; no phase-shifter is applied to this hole 18, one of the phase-shifted holes that is provided on the packed mask 12, FIG. 1b, shows an unpacking mask, designating the unwanted holes to protect the unwanted holes from back filling; holes 11 (provided on the unpacking mask 12) are of larger dimensions than the holes 16 and 18 (provided on the packed mask 10), and 14, FIG. 1c, the final image that is obtained by applying the packed mask and the unpacked mask; desired holes 13 are created.

Figure 2B:
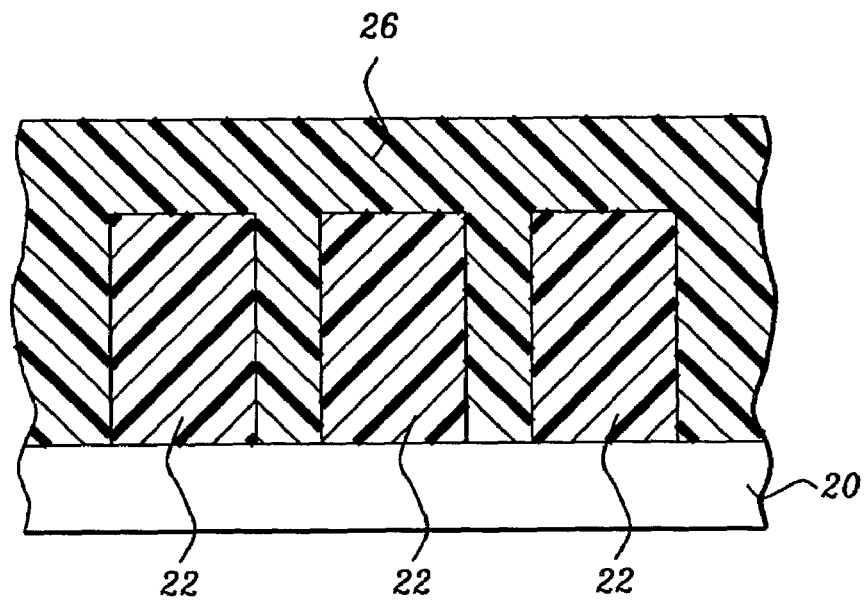

FIGS. 2a through 2d show Packing and Unpacking (PAU) with two coatings of photoresist, as follows:

20, FIG. 2a, a semiconductor surface, typically the surface of a substrate;

22, a first layer of photoresist; the first layer of photoresist has been patterned using the packed mask 23, a padded hole created through the first layer 22 of photoresist 24, a desired hole created through the first layer 22 of photoresist 26, FIG. 2b, a second layer of photoresist deposited over the surface of the patterned first layer 22 of photoresist, filling openings 23 and 24

Figure 2C:
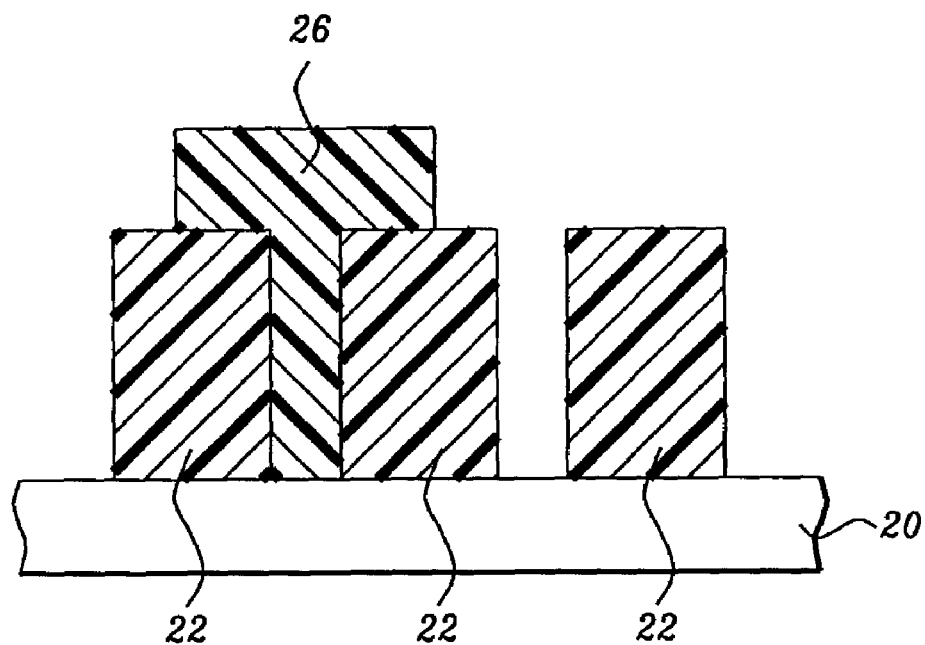
Figure 2D:
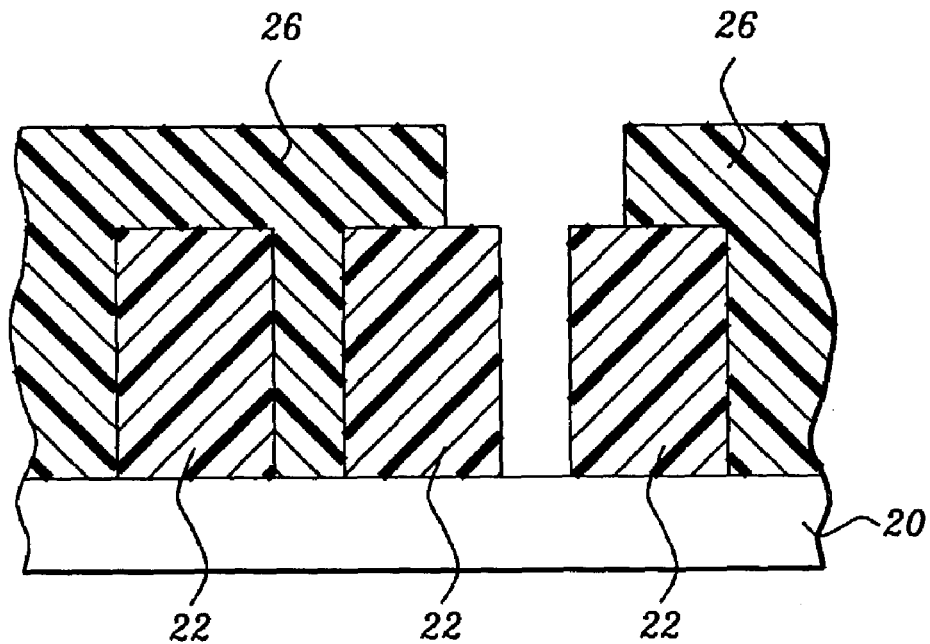

25, FIG. 2c, a first unpack, leaving photoresist in place covering padded opening 23, and 27, FIG. 2d, a second unpack, leaving background layer of photoresist in place.

The specific and preferred selection of the photoresist that is used for layers 22 and 26 of FIGS. 2a through 2c is now discussed.

For the first layer 22 of photoresist, the preferred resist is a positive resist such as I-line resist and KrF resist and ArF resist and F2 resist and EUV resist. This resist is exposed for the packed mask and developed. For the second layer 26 of photoresist, the preferred resist of the invention is a water soluble negative resist. The second layer 26 of photoresist is coated on the delineated first layer 22 of photoresist image without affecting this first delineated layer 22 of photoresist, hence the second layer 26 of photoresist is preferred to comprise a water soluble negative resist. After the second layer 25 of negative photoresist has been deposited, the second layer photolithographic mask is used to expose the second layer 26 of photoresist, using water to develop this layer and create the pattern of layer 26 that is shown in cross sections of FIGS. 2c and 2d.

The advantages of using water soluble photoresist for the second layer 26, FIGS. 2b through 2d, are two-fold:

1. Normal photoresist comprises a solvent that damages the first pattern 22, FIG. 2a, of photoresist, water soluble photoresist does not contain such a solvent, and 2. Water is used for the development of a water soluble layer of photoresist, this water does not damage the (underlying) first layer 22 of photoresist.

The invention can be summarized as follows:

the invention provides for a first layer of photoresist that comprises a positive or negative photoresist, this first layer of resist is exposed and developed with a packed exposure mask and developed in addition to and following creating the exposed and developed first layer of photoresist using a packed exposure mask, a compatible (with the first layer of resist) layer of photoresist is deposited, this without affecting the underlying layer of first photoresist, the two layers can then be cross-linked to form an improved packed image in these two layers of photoresist the second layer of photoresist, layer 26, preferably comprises a water soluble negative resist; this latter layer can be cross linked by exposure by a 365 nm or a 248 nm or a 193 nm or a 157 nm or a EUV or a EB light source, and in the water soluble negative photoresist, it is preferred that this layer comprises 1) a base polymer such as polyvinylacetal (4 to 8%), 2) a cross linking element such as ethyleneurea (0.5 to 2%), 3) photo-active compounds (0.01 to 0.1%), 4) a quencher (between about 1 and 30 ppm) and 5) a solvent such as DIW/IPA, with DIW between about 85 and 90%, IPA between about 4 and 7%.

Of these latter elements, the following details can be provided.

1. a base polymer such as polyvinylacetal has the chemical composition of:

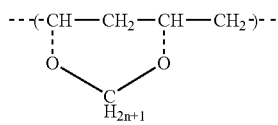

with n having a value between 0 and about 4.

2. a photo-active compound comprising $OCH_3$, $CF_3SO_3$ and $S(CH_3)_2$ 3. of the ethyleneurea, the structure is unknown due to the mixture of various alkyl groups.

Further detail relating to the preferred materials of the invention is provided following.

Base polymer: preferred: water soluble polymers
    More preferred: polyvinyl acetal, polyvinyl pyrrolidone, polyallylic acid, polyvinyl alcohol, polyethylemeimine, polyethylene oxide, polyvinylamine
    Most preferred: polyvinylacetal and copolymers and mixtures thereof Photo-active compounds: Preferred: a water soluble photo acid generator
    More preferred: onium salt derivative, triazine derivative
    Most preferred: onium salt derivative and Mixtures thereof Quencher: Preferred: water soluble amine
    More preferred: ethylamine, dimethylamine, diethylamine, trimethylamine, triethylamine, n-propylamine, isopropylamine, s-butylamine, t-butylamine, cycrohexcylamine, ethylenediamine, hexamethylenediamine, monoethanolamine, diethanolamine, triethanolamine, N-buthyldiethanolamine, TMAH, TBAH, choline
    Most prererred: TBAH and mixtures thereof Cross-linking agent: Preferred: water soluble cross linking agent
    More preferred: urea derivative, melamine derivative
    Most preferred methoxy-methylol-urea and mixtures thereof.

Solvent: Preferred: non-damageable solvent to PR
    More preferred: DIW
    Most preferred: DIW/IPA.

The invention, of applying a water soluble negative-tone photoresist for creating closely spaced contact holes, can be summarized as follows:
    starting with s substrate, a first layer of photoresist is deposited for creation of a pattern of contact holes
    the surface of the first layer of photoresist is exposed with a first mask, the first mask comprising a first and a second pattern of contact holes
    openings are created in the first layer of photoresist in accordance with the first and second pattern of contact holes;
    a second layer of negative-tone photoresist is deposited over the surface of the first layer of photoresist, including the openings created in the first layer of photoresist
    openings are created in the second layer of negative-tone photoresist in accordance with the second pattern of contact holes
    the first pattern of holes comprising contact holes
    the second pattern of holes comprising dummy holes
    an additional step of cross-linking the first layer of photoresist can be performed
    an additional step of hardening the surface of the first layer of photoresist, and
    additionally and prior to depositing a second layer of negative-tone photoresist depositing a layer of photoresist that is compatible with the first layer of photoresist over the first layer of photoresist, followed by cross-linking the first layer of photoresist and the there with compatible layer, forming an improved packed image in these two layers of photoresist.

Alternately, the invention can be summarized as follows:
    starting with s substrate, a first layer of photoresist is deposited for creation of a pattern of contact holes
    the surface of the first layer of photoresist is exposed with a mask, the mask comprising a first and a second pattern of contact holes, creating a first and a second pattern of exposure in the first layer of photoresist
    the surface of the first layer of photo resist is selectively exposed to a source of radiation, the selective exposure being in accordance with the second pattern of exposure in the layer of dual-polarity resist, thereby inhibiting creating openings in the first layer of photoresist in accordance with the second pattern of exposure
    a second layer of water soluble negative tone photoresist is deposited over the first layer of photoresist
    the layer of water soluble negative tone photoresist is developed in accordance with the first pattern of exposure
    the first pattern of exposure comprising contact holes, and the second pattern of exposure comprising dummy holes.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of applying a water soluble negative-tone photoresist for creating closely spaced contact holes, comprising the steps of:
    providing a substrate, said substrate having been provided with a first layer of photoresist for creation of a pattern of contact holes;
    exposing the surface of said first layer of photoresist with a first mask, said first mask comprising a first and a second pattern of contact holes;
    creating openings in said first layer of photoresist in accordance with said first and second pattern of contact holes;
    depositing a second layer of negative-tone photoresist over the surface of said first layer of photoresist, including said openings created in said first layer of photoresist, wherein the second layer of negative-tone photoresist comprising a water soluble negative photoresist contains no solvent that damages the first layer of photoresist; and
    creating openings in said second layer of negative-tone photoresist in accordance with said second pattern of contact holes,
    wherein the water soluble negative photoresist comprises a base polymer, a cross linking element, photo-active compound, a quencher and a solvent, and the base polymer comprises between about 4 to 8% of polyvinylacetal as component of the negative-tone photoresist.

2. The method of claim 1, said first pattern of holes comprising contact holes.

3. The method of claim 1, said second pattern of holes comprising dummy holes.

4. The method of claim 1, with an additional step of cross-linking said first layer of photoresist.

5. The method of claim 1, with an additional step of hardening the surface of said first layer of photoresist.

6. The method of claim 1, additionally and prior to depositing a second layer of negative-tone photoresist depositing a layer of photoresist that is compatible with the first layer of photoresist over the first layer of photoresist, followed by cross-linking the first layer of photoresist and the there-with compatible layer, forming an improved packed image in these two layers of photoresist.

7. The method of claim 6, said cross-linking comprising exposure by a light-source, said light-source is a 365 nm, a 248 nm, a 193 nm, a 157 nm, a EUV or a EB light source.

8. The method of claim 1, said cross linking element comprising between about 0.5 to 2% of ethyleneurea as component of said negative-tone photoresist.

9. The method of claim 1, said photo-active compounds comprising between about 0.01 to 0.1% as component of said negative-tone photoresist.

10. The method of claim 9, said photo-active compound comprising OCH.sub.3, CF.sub.3SO.sub.3, S(CH.sub.3).sub.2 or mixtures thereof.

11. The method of claim 1, said quencher comprising between about 1 and 30 ppm as component of said negative-tone photoresist.

12. The method of claim 1, said solvent comprising DIW/IPA, with DIW between about 85 and 90%, IPA between about 4 and 7% as component of said negative-tone photoresist.

13. The method of claim 1, polyvinylacetal having the chemical composition of:

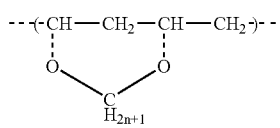

with n having a value between 0 and about 4.

14. The method of claim 1, wherein said base polymer is a water soluble polymer, polyvinyl acetal, polyvinyl pyrrolidone, polyallylic acid, polyvinyl alcohol, polyethylemeimine, polyethylene oxide, polyvinylamine, copolymers or mixtures thereof.

15. The method of claim 1, wherein said photo-active compounds is a water soluble photo acid generator, an onium salt derivative, a triazine derivative or mixtures thereof.

16. The method of claim 1, wherein said quencher is water soluble amine, ethylamine, dimethylamine, diethylamine, trimethylamine, triethylamine, n-propylamine, isopropylamine, s-butylamine, t-butylamine, cycrohexcylamine, ethylenediamine, hexamethylenediamine, monoethanolamine, diethanolamine, triethanolamine, N-buthyldiethanolamine, TMAH, TBAH, choline, TBAH or mixtures thereof.

17. The method of claim 1, wherein said cross-linking element is a water soluble cross linking agent, urea derivative, melamine derivative, methoxy-methylol-urea or mixtures thereof.

18. The method of claim 1, wherein said solvent is a non-damageable solvent to PR, DIW or DIW/IPA or mixtures thereof.

19. A method of creating closely spaced contact holes, comprising the steps of:

providing a substrate, said substrate having been provided with a first layer of dual-polarity resist for creation of a pattern of contact holes;

exposing the surface of said first layer of dual-polarity resist with a mask, said mask comprising a first and a second pattern of contact holes, creating a first and a second pattern of exposure in said first layer of dual-polarity resist;

selectively exposing the surface of said first layer of dual-polarity resist to a source of radiation, said selective exposure being in accordance with said second pattern of exposure in said first layer of dual-polarity resist, thereby inhibiting creating openings in said first layer of dual-polarity resist in accordance with said second pattern of exposure;

depositing a second layer of water soluble negative tone photoresist over the first layer of dual-polarity resist, wherein the second layer of negative-tone photoresist contains no solvent that damages the first layer of photoresist; and developing said second layer of water soluble negative tone photoresist in accordance with said first pattern of exposures, wherein the water soluble negative photoresist comprises a base polymer, a cross linking element, photo-active compound, a quencher and a solvent, and the base polymer comprises between about 4 to 8% of polyvinylacetal as component of the negative-tone photoresist.

20. The method of claim 19, said first pattern of exposure comprising contact holes.

21. The method of claim 19, said second pattern of exposure comprising dummy holes.

22. The method of claim 19, said selectively exposing comprising exposure by a light-source, said light-source is a 365 nm, a 248 nm, a 193 nm, a 157 nm, a EUV or a EB light source.

23. The method of claim 19, said cross linking element comprising between about 0.5 to 2% of ethyleneurea as component of said negative-tone photoresist.

24. The method of claim 19, said photo-active compounds comprising between about 0.01 to 0.1% as component of said negative-tone photoresist.

25. The method of claim 19, said quencher comprising between about 1 and 30 ppm as component of said negative-tone photoresist.

26. The method of claim 19, said solvent comprising DIW/IPA, with DIW between about 85 and 90%, IPA between about 4 and 7% as component of said negative-tone photoresist.

27. The method of claim 19, polyvinylacetal having the chemical composition of:

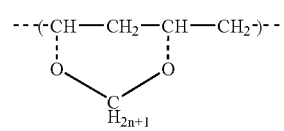

with n having a value between 0 and about 4.

28. The method of claim 19, said photo-active compound comprising OCH.sub.3, CF.sub.3SO.sub.3, S(CH.sub.3).sub.2 or mixtures thereof.

29. The method of claim 19, wherein said base polymer is a water soluble polymer, polyvinyl acetal, polyvinyl pyrrolidone, polyallylic acid, polyvinyl alcohol, polyethylemeimine, polyethylene oxide, polyvinylamine, polyvinylacetal copolymers or mixtures thereof.

30. The method of claim 19, wherein said photo-active compounds is a water soluble photo acid generator, an onium salt derivative, a triazine derivative or mixtures thereof.

31. The method of claim 19, wherein said quencher is water soluble amine, ethylamine, dimethylamine, diethylamine, trimethylamine, triethylamine, n-propylamine, iso-propylamine, s-butylamine, t-butylamine, cycrohexcylamine, ethylenediamine, hexamethylenediamine, monoethanolamine, diethanolamine, triethanolamine, N-buthyldiethanolamine, TMAH, TBAH, choline, TBAH or mixtures thereof.

32. The method of claim 19, wherein said cross-linking element is a water soluble cross linking agent, urea derivative, melamine derivative, methoxy-methylol-urea or mixtures thereof.

33. The method of claim 19, wherein said solvent is a non-damageable solvent to PR, DIW or DID/IPA.

* * * * *

UNITED STATES PATENT AND TRADEMARK OFFICE
CERTIFICATE OF CORRECTION

PATENT NO. : 7,235,348 B2
APPLICATION NO. : 10/443359
DATED : June 26, 2007
INVENTOR(S) : Bang-Chein Ho It is certified that error appears in the above-identified patent and that said Letters Patent is hereby corrected as shown below:

On the front page of the patent:

item (73) - add the assignee --AZ Electronic Materials (Japan) K.K, Tokyo (JP).-- after the assignee Taiwan Semiconductor Manufacturing Co., Ltd., Hsinchu (TW)

Signed and Sealed this

Tenth Day of November, 2009

David J. Kappos
*Director of the United States Patent and Trademark Office*